United States Patent
Son

(10) Patent No.: US 10,361,212 B2
(45) Date of Patent: Jul. 23, 2019

(54) SEMICONDUCTOR MEMORY DEVICES

(71) Applicant: Samsung Electronics Co., Ltd., Suwon-si, Gyeonggi-do (KR)

(72) Inventor: Jongpil Son, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 4 days.

(21) Appl. No.: 15/699,031

(22) Filed: Sep. 8, 2017

(65) Prior Publication Data

US 2018/0204843 A1 Jul. 19, 2018

(30) Foreign Application Priority Data

Jan. 17, 2017 (KR) .................. 10-2017-0008221

(51) Int. Cl.
*H01L 27/112* (2006.01)
*G11C 17/16* (2006.01)

(52) U.S. Cl.
CPC ........ *H01L 27/11206* (2013.01); *G11C 17/16* (2013.01)

(58) Field of Classification Search
CPC .................. H01L 27/11206; G11C 17/16
See application file for complete search history.

(56) References Cited

U.S. PATENT DOCUMENTS

| | | | |
|---|---|---|---|
| 5,811,869 A | 9/1998 | Seyyedy et al. | |
| 5,986,322 A | 11/1999 | McCollum et al. | |
| 6,388,305 B1 | 5/2002 | Berlin et al. | |
| 6,674,667 B2 | 1/2004 | Forbes | |
| 6,798,693 B2 | 9/2004 | Peng | |
| 6,812,122 B2 | 11/2004 | Bertin et al. | |
| 7,790,517 B2 | 9/2010 | Manabe et al. | |
| 7,956,397 B2 | 6/2011 | Wada et al. | |
| 8,514,648 B2 | 8/2013 | Son et al. | |
| 8,674,475 B2 | 3/2014 | Kim et al. | |
| 2006/0291267 A1* | 12/2006 | Jenne .................... | G11C 17/16 365/102 |

(Continued)

FOREIGN PATENT DOCUMENTS

| | | |
|---|---|---|
| JP | 3275893 B2 | 4/2002 |
| JP | 2004525508 A | 8/2004 |

(Continued)

*Primary Examiner* — Su C Kim
(74) *Attorney, Agent, or Firm* — Harness, Dickey & Pierce, P.L.C.

(57) ABSTRACT

A semiconductor memory device includes a semiconductor substrate having an active region of a first conductivity type defined by a device isolation layer, a first impurity region in the active region, an anti-fuse gate electrode on the semiconductor substrate and extending across the first impurity region, an anti-fuse gate dielectric layer between the anti-fuse gate electrode and the first impurity region, a selection gate electrode on the semiconductor substrate and extending across the active region, a selection gate dielectric layer between the selection gate electrode and the active region, and a second impurity region in the active region between the selection gate electrode and the anti-fuse gate electrode. The first and second impurity regions have impurities of a second conductivity type. The first impurity region has an impurity concentration less than the impurity concentration of the second impurity region.

5 Claims, 8 Drawing Sheets

(56) References Cited

U.S. PATENT DOCUMENTS

| | | |
|---|---|---|
| 2008/0042235 A1 | 2/2008 | Kodama |
| 2008/0089136 A1* | 4/2008 | Yoo .................. H01L 27/115 |
| | | 365/185.29 |
| 2013/0161761 A1 | 6/2013 | Luan et al. |
| 2015/0311215 A1 | 10/2015 | Luan |

FOREIGN PATENT DOCUMENTS

| | | | |
|---|---|---|---|
| JP | 2007305947 | A | 11/2007 |
| JP | 2008047702 | A | 2/2008 |
| JP | 4249774 | B2 | 4/2009 |
| JP | 4427534 | B2 | 3/2010 |
| KR | H10503062 | A | 3/1998 |
| KR | H11502068 | A | 2/1999 |
| KR | 100230158 | B1 | 11/1999 |
| KR | 10-0323174 | | 3/2002 |
| KR | 100384259 | B1 | 5/2003 |
| KR | 100416860 | B1 | 2/2004 |
| KR | 100524039 | B1 | 10/2005 |
| KR | 20090103613 | A | 10/2009 |
| KR | 20090108457 | A | 10/2009 |
| KR | 20100039538 | A | 4/2010 |
| KR | 20110120044 | A | 11/2011 |

* cited by examiner

SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2017-0008221 filed on Jan. 17, 2017 the disclosure of which is hereby incorporated by reference in its entirety.

BACKGROUND

The example embodiments relate to a semiconductor memory device, and/or to a semiconductor memory device including an anti-fuse cell array.

Semiconductor devices used in computers, mobile devices, or the like are typically highly integrated and exhibit high performance. Memory devices, as an example of semiconductor devices include memory cells with increasing capacity and speed, and much effort is currently made in reducing the size of semiconductor devices that include a plurality of memory cells having high capacity and being configured to operate at higher speed.

The higher the capacity of a semiconductor device, the more an amount of information can be stored in order to establish an operating environment of the semiconductor device. Technologies related to anti-fuse circuits are used so as to store information for setting an operating environment of the semiconductor device.

SUMMARY

Embodiments of the inventive concepts provide a semiconductor memory device including anti-fuse cells with superior electrical characteristics.

An object of the inventive concepts is not limited to the above-mentioned one, and other objects which have not been mentioned above will be clearly understood to those skilled in the art from the following description.

According to example embodiments of the inventive concepts, a semiconductor memory device may include a semiconductor substrate including an active region defined by a device isolation layer, the active region having a first conductivity or conductivity type, a first impurity region in the active region; an anti-fuse gate electrode on the semiconductor substrate and extending across the first impurity region, an anti-fuse gate dielectric layer between the anti-fuse gate electrode and the first impurity region, a selection gate electrode on the semiconductor substrate and extending across the active region, the selection gate electrode being spaced apart from the anti-fuse gate electrode, a selection gate dielectric layer between the selection gate electrode and the active region, and a second impurity region in the active region between the selection gate electrode and the anti-fuse gate electrode, the second impurity region being connected to the first impurity region. The first and second impurity regions may have impurities of a second conductivity or conductivity type. The first impurity region may have an impurity concentration less than the impurity concentration of the second impurity region.

According to example embodiments of the inventive concepts, a semiconductor memory device may include a semiconductor substrate including an active region defined by a device isolation layer, the active region having a first conductivity or conductivity type, anti-fuse gate electrodes on the semiconductor substrate and extending across the active region, a pair of selection gate electrodes between the anti-fuse gate electrodes and extending across the active region, a first impurity region including impurities of a second conductivity or conductivity type that are doped in the active region below the anti-fuse gate electrodes, anti-fuse gate dielectric layers between the anti-fuse gate electrodes and the first impurity region, selection gate dielectric layers between the selection gate electrodes and the active region, and second impurity regions between the selection gate electrodes and the anti-fuse gate electrodes and doped with impurities of the second conductivity or conductivity type. An impurity concentration of the second conductivity or conductivity type may be less in the first impurity region than in the second impurity regions.

Example embodiments relate to a semiconductor memory device that includes a semiconductor substrate including an active region, the active region having a first conductivity type, an anti-fuse gate electrode on the semiconductor substrate, an anti-fuse gate dielectric layer between the anti-fuse gate electrode and the substrate, a selection gate electrode on the semiconductor substrate, the selection gate electrode being spaced apart from the anti-fuse gate electrode, and a selection gate dielectric layer between the selection gate electrode and the substrate.

Details of other example embodiments are included in the description and drawings.

DETAILED DESCRIPTION OF EMBODIMENTS

It will be hereinafter described in detail a semiconductor memory device according to example embodiments of the inventive concepts in conjunction with the accompanying drawings.

Figure 1:
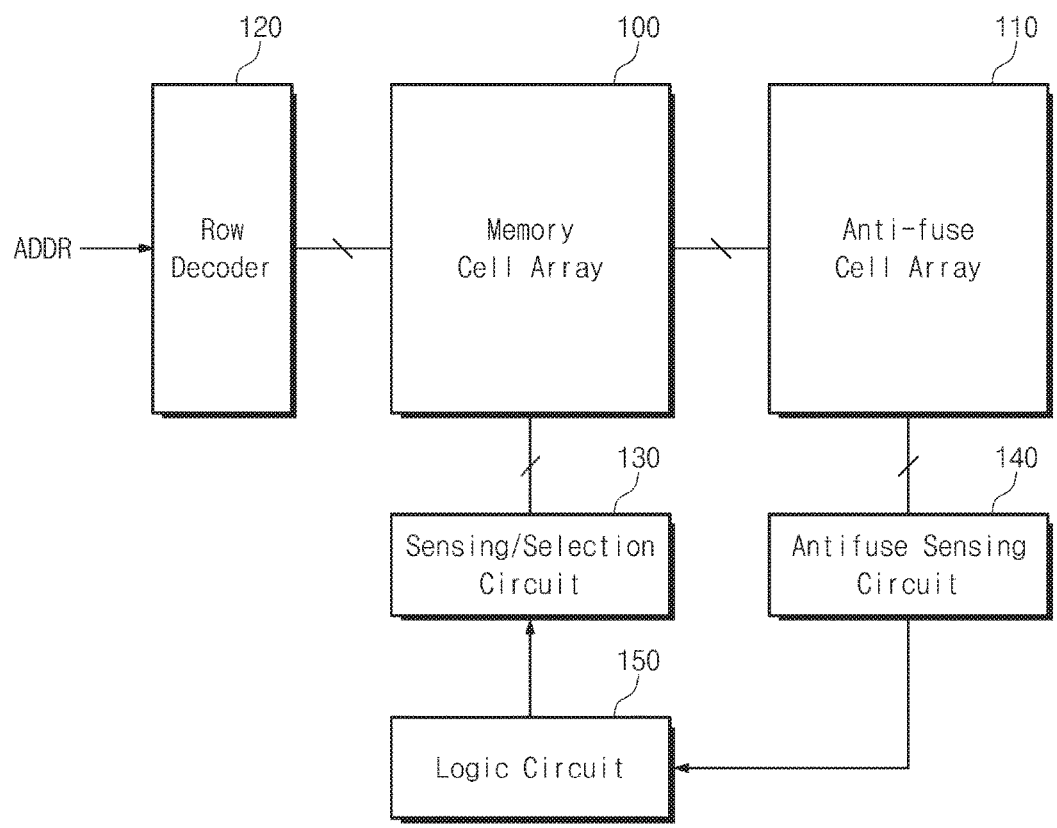
FIG. 1 is a block diagram roughly illustrating a semiconductor memory device according to example embodiments of the inventive concepts.

FIG. 1 is a block diagram roughly illustrating a semiconductor memory device according to example embodiments of the inventive concepts.

Referring to FIG. 1, a semiconductor memory device may include a memory cell array 100, an anti-fuse cell array 110, a row decoder 120, a memory cell sensing/selection circuit 130, an anti-fuse sensing circuit 140, and a repair logic circuit 150.

The memory cell array 100 may include a plurality of memory cells connected to word lines and bit lines. The memory cells may include a volatile memory element or a nonvolatile memory element.

The anti-fuse cell array 110 may include a plurality of anti-fuse cells connected between anti-fuse word lines and anti-fuse bit lines. The anti-fuse cells may store information (referred to as hereinafter fail cell information) about fail cells included in the memory cell array 100. That is, the anti-fuse cells are electrically programmed with address data of the fail cells.

The row decoder 120 may select word lines by decoding an externally input address ADDR. A data may be readout from anti-fuse cells connected to a selected word line and memory cells connected to the selected word line.

The memory cell sensing/selection circuit 130 may select one or more of bit lines of the memory cell array 100 in response to a control signal provided form the logic circuit 150.

The anti-fuse sensing circuit 140 may detect and amplify the fail cell information stored in the anti-fuse cells of the anti-fuse cell array 110 connected to the selected word line. The anti-fuse sensing circuit 140 may provide the logic circuit 150 with a fail column address readout from the anti-fuse cell array 110.

Based on an address of the fail cell stored in the plurality of the anti-fuse memory cells, the logic circuit 150 may determine whether the externally input address ADDR agrees to an address of the fail cell. When the externally input address ADDR agrees to the address of the fail cell, the logic circuit 150 may read the fail cell information from the anti-fuse cell corresponding to the fail cell and then provide the fail cell information to outside.

Figure 2:
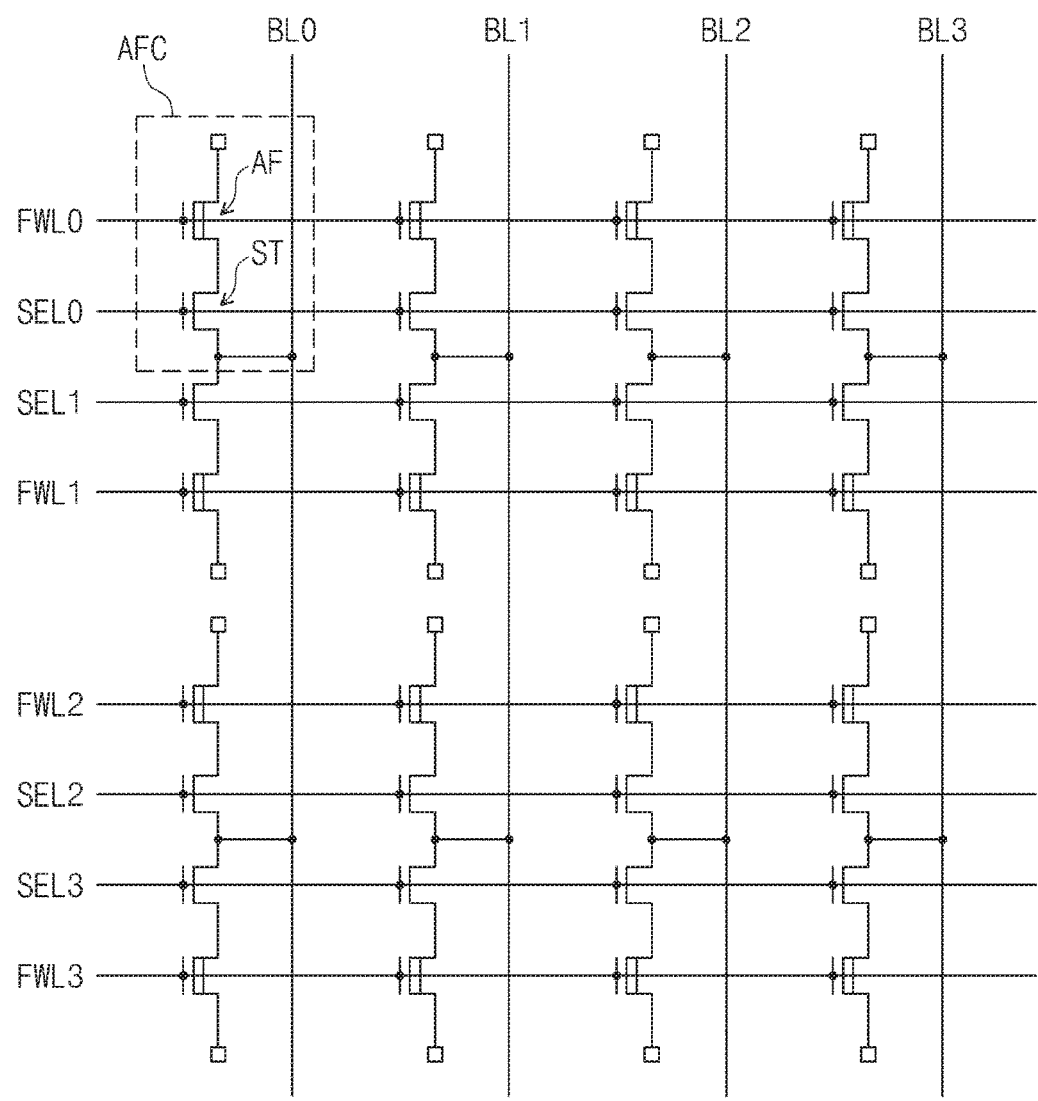
FIG. 2 is a circuit diagram of an anti-fuse cell array according to embodiments of the inventive concepts.

FIG. 2 is a circuit diagram of an anti-fuse cell array according to embodiments of the inventive concepts.

Referring to FIG. 2, an anti-fuse cell array may include a plurality of cell selection lines SEL0, SEL1, SEL2, and SEL3, fuse word lines FWL0, FWL1, FWL2, and FWL3, bit lines BL0, BL1, BL2, and BL3, and a plurality of anti-fuse memory cells AFC that are two-dimensionally arranged or spaced along rows and column.

Each, or at least one, of the anti-fuse memory cells AFC may include a selection transistor ST and an anti-fuse AF connected to each other in series. In some example embodiments, the selection transistor ST and the anti-fuse AF may be a metal oxide semiconductor field effect transistor (MOSFET) of a first conductivity.

The selection transistor ST may be connected between the anti-fuse AF and the bit lines BL0 to BL3, and controlled by the cell selection lines SEL0 to SEL3. The cell selection lines SEL0 to SEL3 may be connected to gate electrodes of the selection transistors ST arranged or spaced along a row direction.

The anti-fuse AF may have a drain terminal connected to a source terminal of the selection transistor ST and a source terminal electrically floated. When an anti-fuse gate dielectric layer (see GI of FIG. 4) is supplied with a high voltage, the anti-fuse gate dielectric layer GI may experience breakdown and thus the anti-fuse AF may be programmed. That is, the anti-fuse AF may be programmed when a voltage is applied to the fuse word lines FWL0 to FWL3. The fuse word lines FWL0 to FWL3 may be connected to anti-fuse gate electrodes of the anti-fuses AF arranged or spaced along the row direction.

In some example embodiments, the bit lines BL0 to BL3 may be shared by a pair of the anti-fuse cells AFC adjacent to each other in a column direction. The bit lines BL0 to BL3 may be commonly connected to drain terminals of a pair of the selection transistors ST.

In some example embodiments, when a programming operation is performed on a selected one of the anti-fuse cells AF, the selection transistor ST of the selected anti-fuse cell AFC may be turned on and a ground voltage (or 0 V) may be applied to a selected one of the bit lines BL0 to BL3. And, a programming voltage (high voltage) may be applied to a selected one of the anti-fuse word lines FWL0 to FWL3. In this description, the programming voltage may be a desired, or alternatively predetermined voltage capable of inducing breakdown of a gate dielectric layer of the selected anti-fuse AF. In addition, unselected ones of the bit lines BL0 to BL3 may be supplied with a desired, or alternatively predetermined bit line voltage so as not to induce breakdown of a gate dielectric layer of the anti-fuse AF, and unselected ones of the anti-fuse word lines FWL0 to FWL3 may be supplied with a ground voltage (or 0 V).

Under the voltage condition described above, a high electric field may be applied to a gate dielectric layer between the anti-fuse gate electrode of the selected anti-fuse AF and a drain terminal of the anti-fuse AF, and then breakdown may occur on the gate dielectric layer of the selected anti-fuse AF. Accordingly, an ohmic contact may be produced between the drain terminal and the anti-fuse gate electrode. As a result, a current path may be created between the anti-fuse gate electrode of the anti-fuse AF and the selected one of the bit lines BL0 to BL3.

Figure 3:
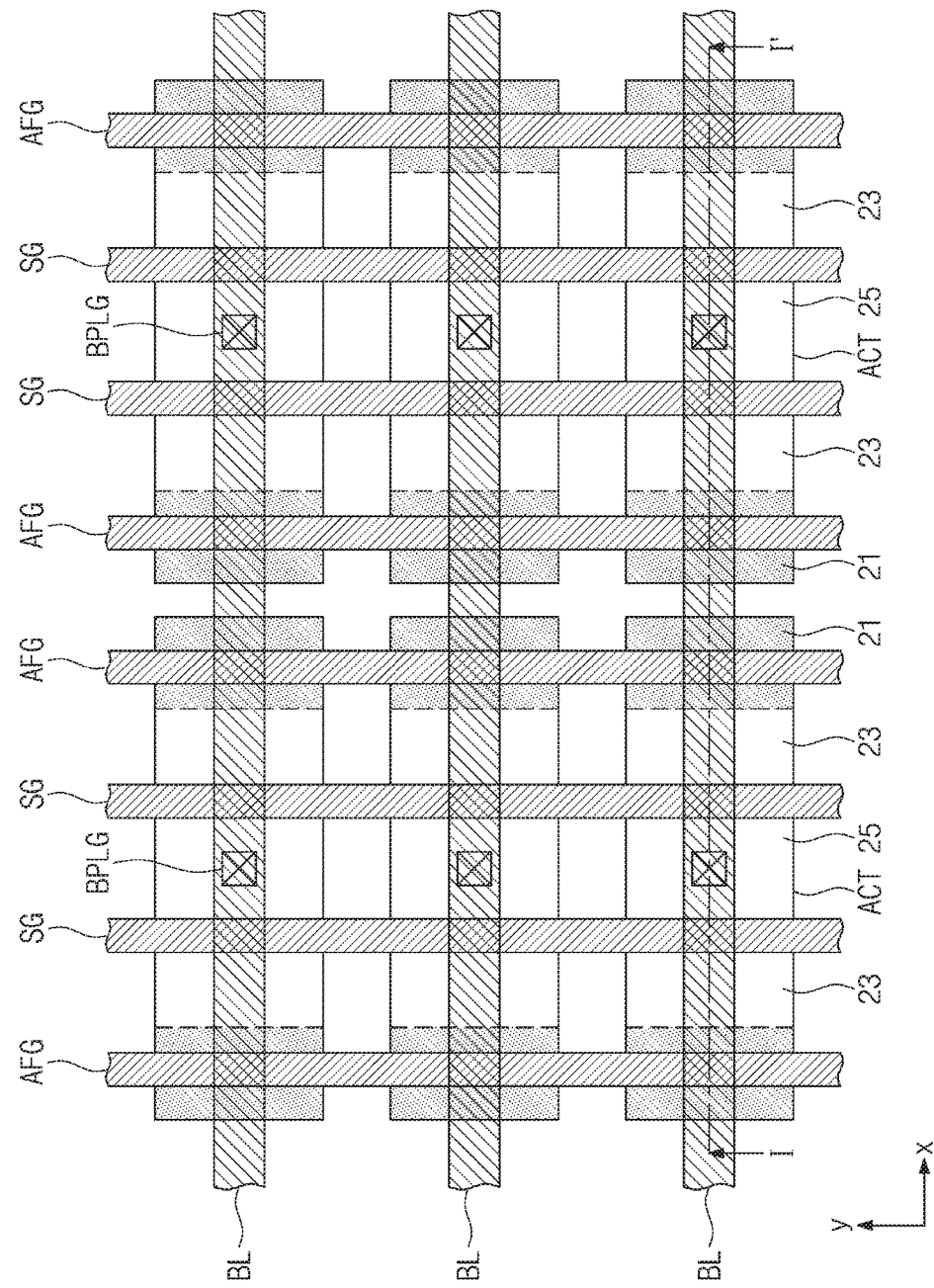
FIG. 3 is a plan view of an anti-fuse cell array according to embodiments of the inventive concepts.
Figure 4:
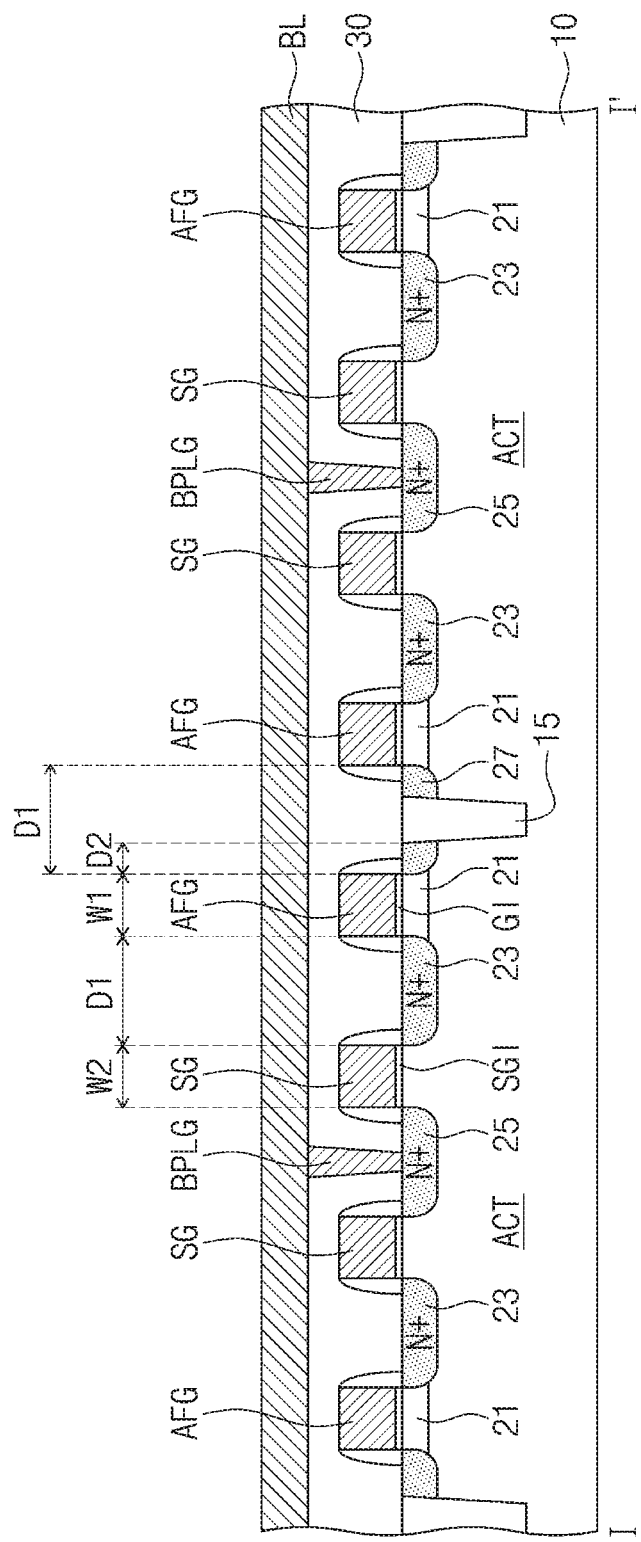
FIG. 4 is a cross-sectional view taken along line I-I' of FIG. 3 illustrating an anti-fuse cell array according to example embodiments of the inventive concepts.

FIG. 3 is a plan view of an anti-fuse cell array according to embodiments of the inventive concepts. FIG. 4 is a cross-sectional view taken along line I-I' of FIG. 3 illustrating an anti-fuse cell array according to example embodiments of the inventive concepts.

Referring to FIGS. 3 and 4, a semiconductor substrate 10 of a first conductivity may be provided to include a plurality of active regions ACT defined by a device isolation layer 15. For example, the semiconductor substrate 10 may be doped with p-type impurities.

The device isolation layer 15 may be formed by forming a trench in the semiconductor substrate 10 and then filling the trench with an insulation layer.

The active regions ACT may have a shape of bar or line having a longitudinal axis in an x-direction. The active regions ACT may be two-dimensionally arranged or spaced along x- and y-directions crossing each other.

In some example embodiments, each, or at least one, of the active regions ACT may be provided thereon with a pair of anti-fuse memory cells. Selection gate electrodes SG and anti-fuse gate electrodes (AFG) may run across the active regions (ACT) and extend in the y-direction.

On each, or at least one, active region ACT, a pair of the selection gate electrodes SG may be disposed between a pair of the anti-fuse gate electrodes AFG. In some example embodiments, the anti-fuse gate electrodes AFG may each, or at least one, have a first width W1, and the selection gate electrodes SG may each, or at least one, have a second width W2 substantially the same as the first width W1. The selection gate electrodes SG and the anti-fuse gate electrodes AFG may be disposed spaced apart from each other at a first distance D1 (e.g., substantially the same interval).

The anti-fuse gate electrodes AFG on different active regions ACT may be disposed adjacent to each other in the x-direction. In some example embodiments, as viewed in plan, the device isolation layer 15 may have portions disposed between the anti-fuse gate electrodes AFG adjacent to each other in the x-direction. As viewed in plan, the anti-fuse gate electrodes AFG may be spaced apart from the device isolation layer 15 at a second distance D2 less than the first distance D1 and also less than the first width W1 of the anti-fuse gate electrode AFG. The second distance D2 may be less than an interval between the active regions ACT.

The selection gate electrodes SG and the anti-fuse gate electrodes AFG may include one or more of doped semiconductor (e.g., doped silicon, etc.), metal (e.g., tungsten, copper, aluminum, etc.), conductive metal nitride (e.g., titanium nitride, tantalum nitride, etc.), and transition metal (e.g., titanium, tantalum, etc.).

Spacers may be disposed on opposite sidewalls of each, or at least one, of the selection gate electrodes SG and the anti-fuse gate electrodes AFG.

Selection gate dielectric layers SGI may be disposed between the selection gate electrodes SG and the semiconductor substrate 10, and anti-fuse gate dielectric layers GI may be disposed between the anti-fuse gate electrodes AFG and the semiconductor substrate 10.

The selection gate dielectric layers SGI and the anti-fuse gate dielectric layers GI may include oxide (e.g., silicon oxide), nitride (e.g., silicon nitride), oxynitride (e.g., silicon oxynitride), and/or high-k dielectric (e.g., insulating metal oxide such as hafnium oxide, aluminum oxide, or the like).

In some example embodiments, the selection gate dielectric layers SGI and the anti-fuse gate dielectric layers GI may be simultaneously or contemporaneously formed to thereby have the same material and thickness.

In some example embodiments, channel impurity regions 21 may be disposed in the active regions ACT below the anti-fuse gate electrodes AFG. The channel impurity regions 21 may be formed by implanting the semiconductor substrate 10 of the first conductivity with impurities of a second conductivity. The anti-fuse gate electrodes AFG may be disposed to run across the channel impurity regions 21. The device isolation layer 15 may have a portion between the channel impurity regions 21 adjacent to each other.

Source impurity regions 23 may be disposed in the active regions ACT between the selection gate electrodes SG and the anti-fuse gate electrodes AFG. Common drain impurity regions 25 may be disposed in the active regions ACT between the selection gate electrodes SG adjacent to each other.

The source impurity regions 23 and the common drain impurity regions 25 may be formed by implanting the semiconductor substrate 10 of the first conductivity with impurities of the second conductivity. One of the first and second conductivities may be an n-type conductivity, and the other of the first and second conductivities may be a p-type conductivity. In some example embodiments, the source impurity regions 23 and the common drain impurity regions 25 may be simultaneously or contemporaneously formed to thereby have substantially the same impurity concentration and implantation depth. The source impurity regions 23 and the common drain impurity regions 25 may have a second-conductivity impurity concentration greater than the impurity concentration of the channel impurity region 21. In addition, the source impurity regions 23 and the common drain impurity regions 25 may have their depth greater than the depth of the channel impurity region 21.

In some example embodiments, dummy impurity regions 27 may be disposed in the active region ACT between the anti-fuse gate electrodes AFG adjacent to each other. The dummy impurity regions 27 may be disposed between the channel impurity regions 21 adjacent to each other and in contact with the device isolation layer 15.

The dummy impurity regions 27, together with the source impurity regions 23 and the common drain impurity regions 25, may be formed by implanting the semiconductor substrate 10 with impurities of the second conductivity using the anti-fuse gate electrodes AFG and the selection gate electrodes SG as an ion implantation mask. The dummy impurity regions 27 may thus be formed to have substantially the same impurity concentration and depth as those of the source impurity regions 23 and the common drain impurity regions 25.

In some example embodiments, the channel impurity region 21 may be disposed between the dummy impurity region 27 and the source impurity region 23 and connected to the source impurity region 23.

The semiconductor substrate 10 may be provided thereon with an interlayer dielectric layer 30 covering the selection gate electrodes SG and the anti-fuse gate electrodes AFG. The interlayer dielectric layer 30 may be formed by depositing an insulation layer on the semiconductor substrate 10 so as to cover the selection gate electrodes SG and the anti-fuse gate electrodes AFG and then planarizing a top surface of the insulation layer.

In some example embodiments, as the selection gate electrodes SG and the anti-fuse gate electrodes AFG are disposed spaced apart from each other at substantially the same interval, the interlayer dielectric layer 30 may have an enhanced flatness when being formed to fill between the selection gate electrodes SG and the anti-fuse gate electrodes AFG.

The interlayer dielectric layer 30 may be provided therethrough with bit line contact plugs (BPLG) each, or at least one, of which is connected to a corresponding one of the common drain impurity regions 25.

The interlayer dielectric layer 30 may be provided thereon with bit lines BL extending across the selection gate electrodes SG and the anti-fuse gate electrodes AFG. The bit lines BL may be coupled to the bit line contact plugs BPLG arranged or spaced along the x-direction.

In some example embodiments, the anti-fuse AF may have a structure in which a dielectric layer is interposed between two conductive layers (e.g., the anti-fuse gate electrode AFG and the source impurity region 23), namely a capacitor structure. The anti-fuse AF may be programmed when the anti-fuse gate dielectric layer GI experiences breakdown caused by a high voltage applied to two conductive layers.

In detail, a selected anti-fuse AF may be programmed when a selected selection gate electrode SG is supplied with a turn-on voltage, a selected bit line BL is supplied with a ground voltage (or 0 V), and a selected anti-fuse gate electrode AFG is supplied with a high voltage. Under the voltage condition above, breakdown may occur on the anti-fuse gate dielectric layer GI between the anti-fuse gate electrode AFG and the source impurity region 23, and an ohmic contact may be made between the anti-fuse gate electrode AFG and the channel impurity region 21. That is, the anti-fuse gate electrode AFG may be electrically connected to the source impurity region 23 through the channel impurity region 21 and the anti-fuse gate dielectric layer GI that has experienced breakdown. Therefore, a programming current may flow from the anti-fuse gate electrode AFG through the channel impurity region 21 to the common drain impurity region 25.

In some example embodiments, as the anti-fuse gate electrode AFG is provided thereunder with the channel impurity region 21 whose conductivity is the same as that of the source impurity region 23, it may be possible to reduce a parasitic current flowing to the semiconductor substrate 10 from the anti-fuse gate electrode AFG of the programmed anti-fuse AF. As a result, when sensing whether or not the anti-fuse cells are programmed, improvement may be achieved in current distribution measured from programmed anti-fuse cells.

Figure 5:
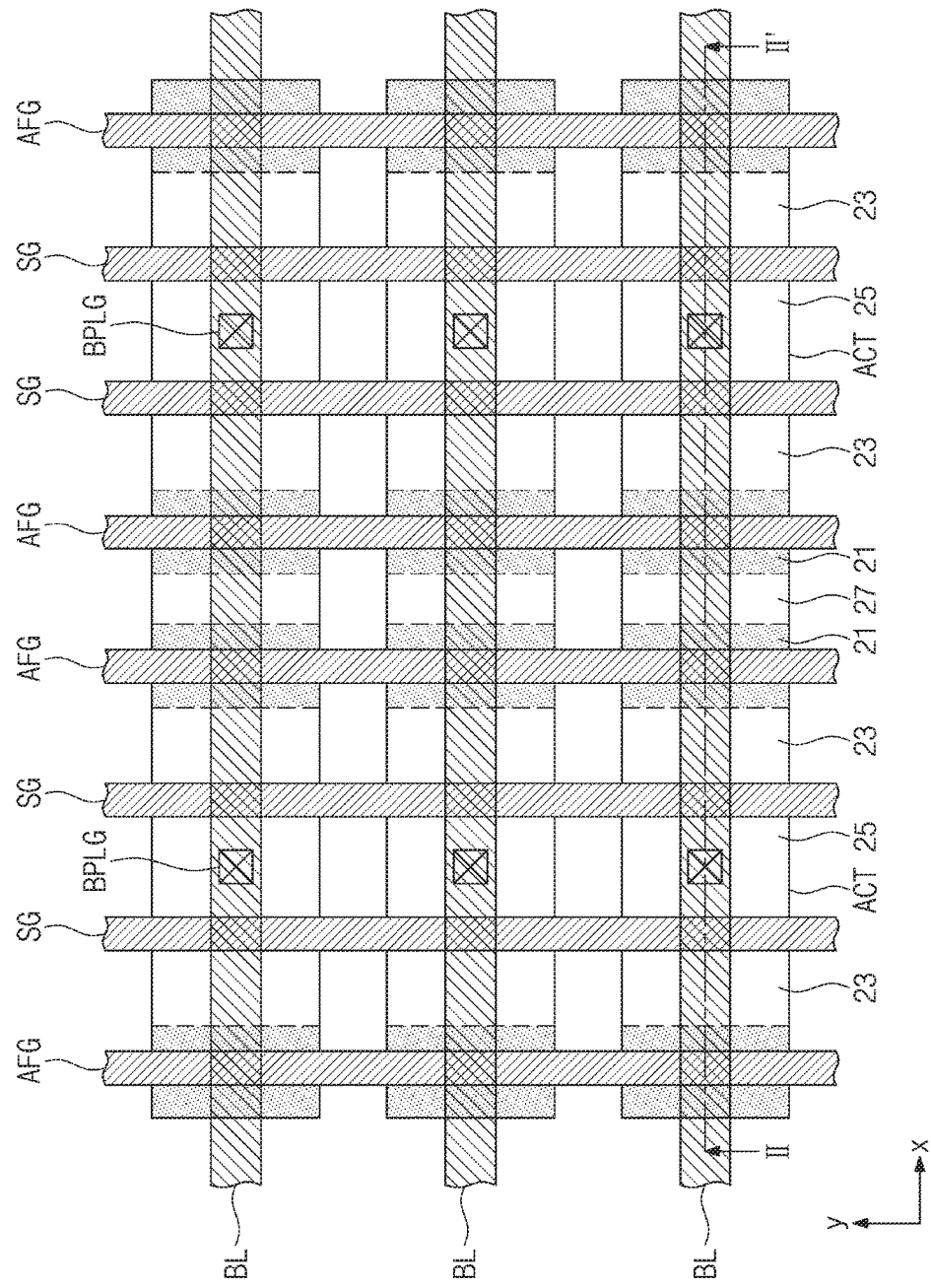
FIG. 5 is a plan view of an anti-fuse cell array according to embodiments of the inventive concepts.
Figure 6:
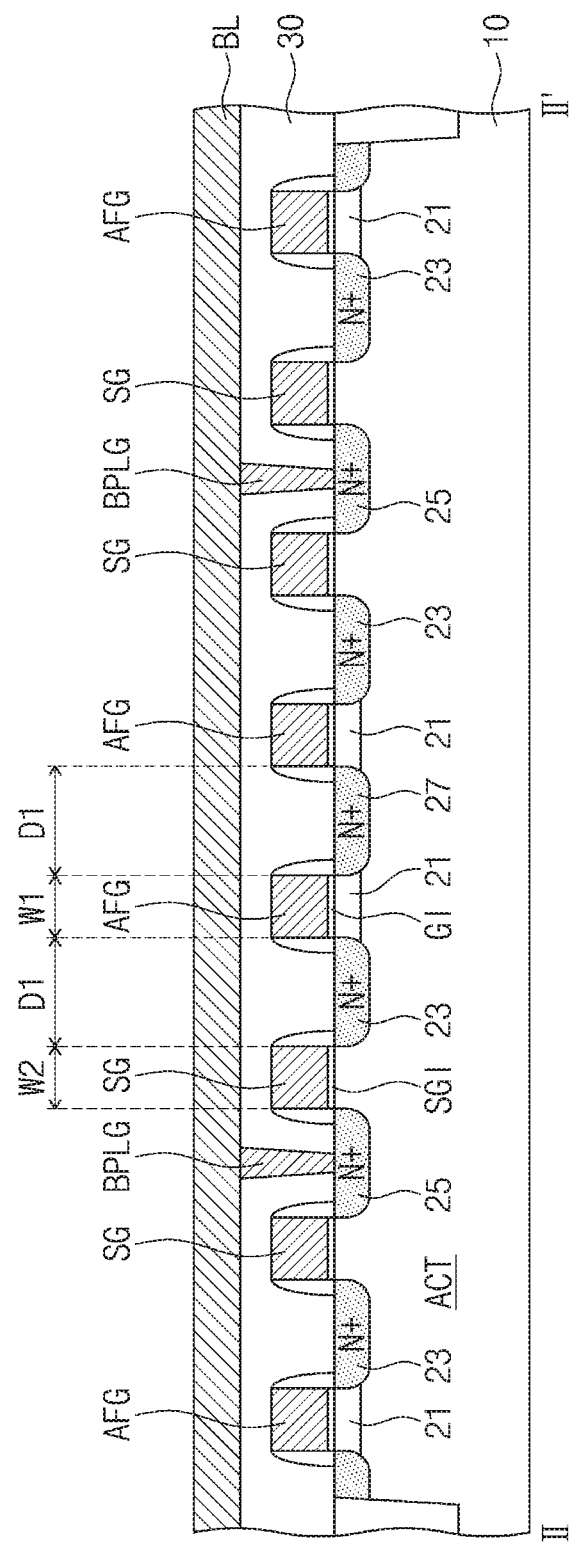
FIG. 6 is a cross-sectional view taken along line II-II' of FIG. 5 illustrating an anti-fuse cell array according to example embodiments of the inventive concepts.

FIG. 5 is a plan view of an anti-fuse cell array according to embodiments of the inventive concepts. FIG. 6 is a cross-sectional view taken along line II-II' of FIG. 5 illustrating an anti-fuse cell array according to example embodiments of the inventive concepts. In the embodiment shown in FIGS. 5 and 6, a detailed description of technical features repetitive of those discussed with reference to FIGS. 3 and 4 is omitted, and a difference will be explained in detail.

Referring to FIGS. 5 and 6, the semiconductor substrate 10 may include a plurality of the active regions ACT defined by the device isolation layer 15. In the current embodiment, the active regions ACT may have linear shapes extending in parallel along the x-direction, and each, or at least one, of the active regions ACT may be provided thereon with at least two pairs of the anti-fuse cells.

In detail, the selection gate electrodes SG and the anti-fuse gate electrodes AFG may be disposed to run across the active regions ACT, and a pair of the anti-fuse gate electrodes AFG may be disposed between the selection gate electrodes SG spaced apart from each other.

As discussed above, the anti-fuse gate electrodes AFG may each, or at least one, have the first width W1 substantially the same as the second width W2 of each, or at least one, of the selection gate electrodes SG, and the anti-fuse gate electrodes AFG and the selection gate electrodes SG may be disposed spaced apart from each other at substantially the same first distance D1. In addition, the channel impurity regions 21 may be disposed in the active regions ACT below the anti-fuse gate electrodes AFG.

In certain embodiments, the dummy impurity regions 27 may be disposed in the active region ACT between the anti-fuse gate electrodes AFG adjacent to each other. That is, the dummy impurity regions 27 may be disposed between adjacent channel impurity regions 21.

The dummy impurity regions 27, together with the source impurity regions 23 and the common drain impurity regions 25, may be formed by implanting the semiconductor substrate 10 with impurities of the second conductivity. Accordingly, the dummy impurity regions 27 may be formed to have substantially the same impurity concentration and depth as those of the source impurity regions 23 and the common drain impurity regions 25. The dummy impurity regions 27 may be electrically floated when a selected anti-fuse is programmed.

Figure 7:
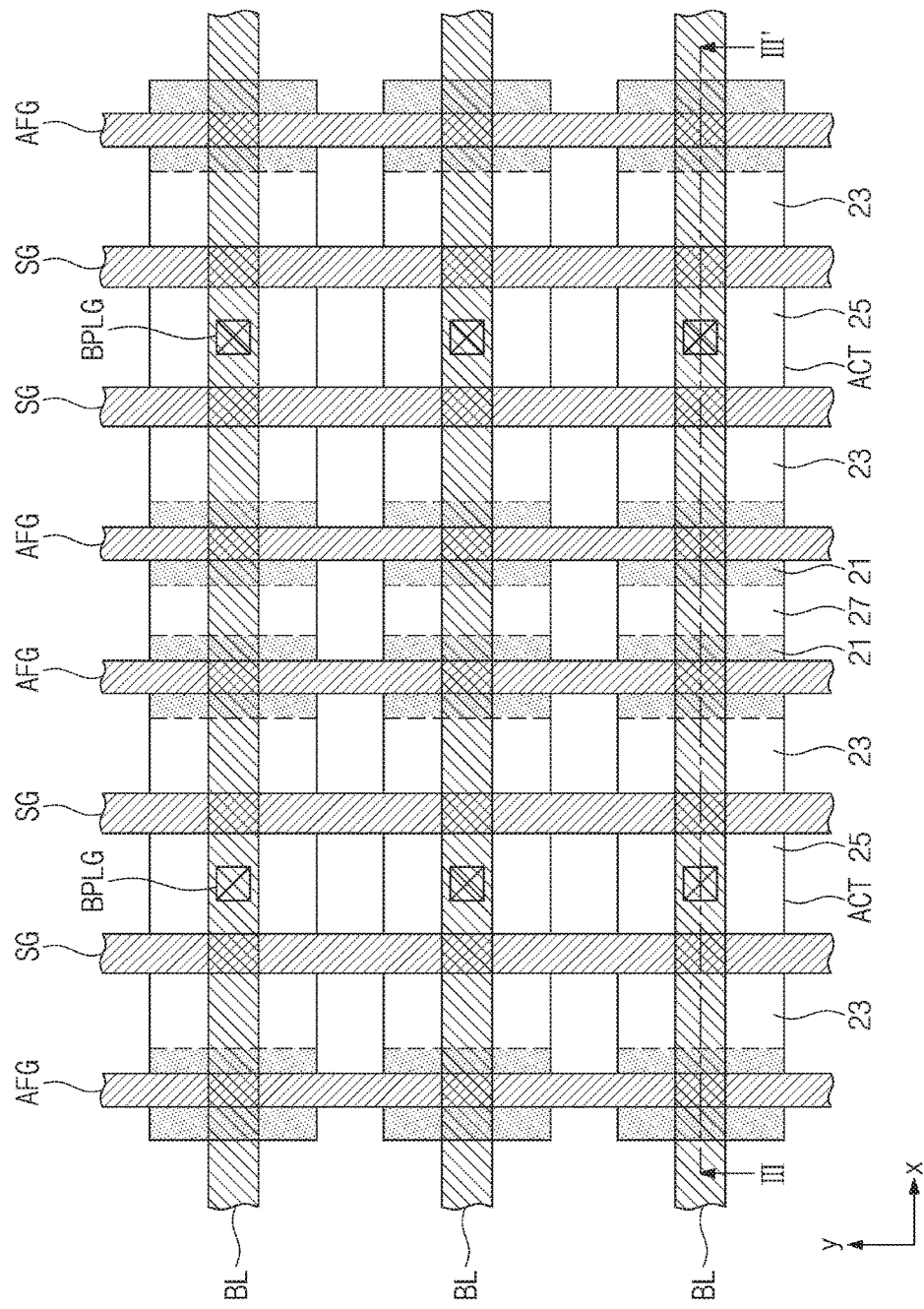
FIG. 7 is a plan view of an anti-fuse cell array according to embodiments of the inventive concepts.
Figure 8:
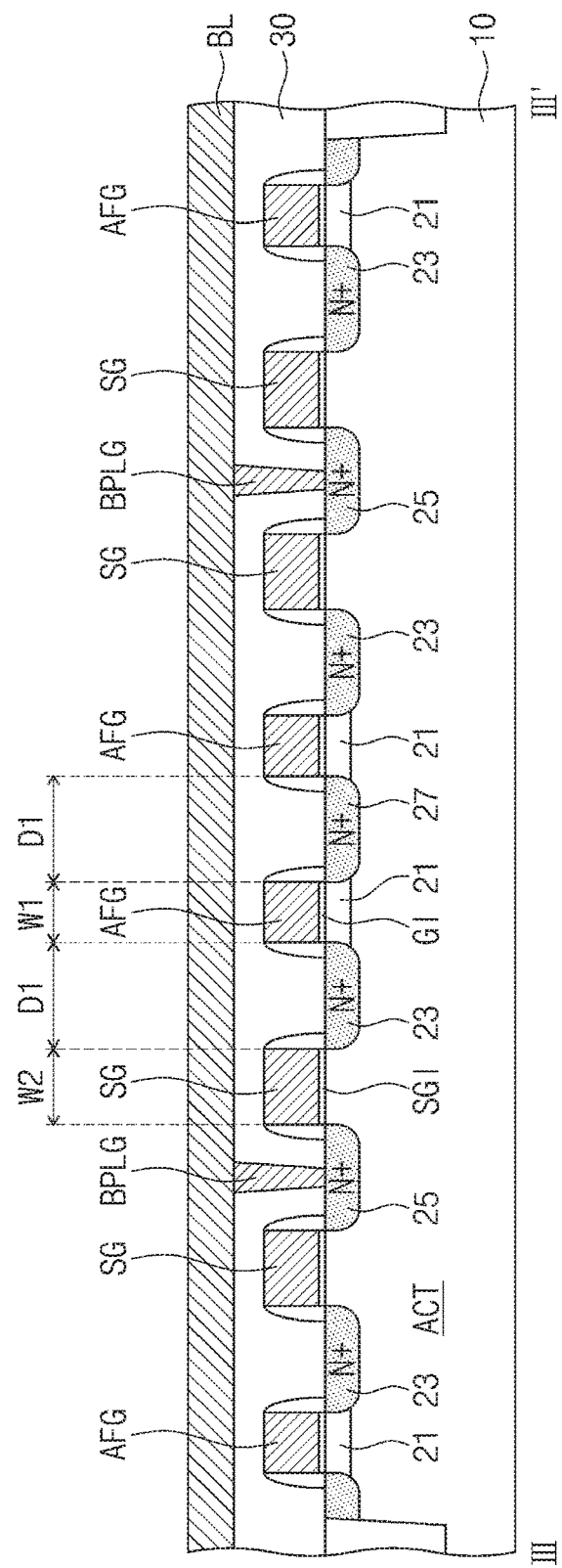
FIG. 8 is a cross-sectional view taken along line III-III' of FIG. 7 illustrating an anti-fuse cell array according to example embodiments of the inventive concepts.

FIG. 7 is a plan view of an anti-fuse cell array according to embodiments of the inventive concepts. FIG. 8 is a cross-sectional view taken along line III-III' of FIG. 7 illustrating an anti-fuse cell array according to example embodiments of the inventive concepts. In the embodiment shown in FIGS. 7 and 8, a detailed description of technical features repetitive of those discussed with reference to FIGS. 5 and 6 is omitted, and a difference will be explained in detail.

In the embodiment of FIGS. 7 and 8, the selection gate electrodes SG and the anti-fuse gate electrodes AFG may be disposed to run across the active regions ACT and spaced apart from each other at substantially the same first distance D1. The anti-fuse gate electrodes AFG may each, or at least one, have a first width W1, and the selection gate electrodes SG may each, or at least one, have a second width W2 greater than the first width W1. As the anti-fuse gate electrodes AFG each, or at least one, have the first width W1 less than the second width W2 of each, or at least one, of the selection gate electrodes SG, the channel impurity regions 21 may also each, or at least one, have a reduced width. When the anti-fuse cells are programmed, reduction may be achieved in distribution of places where the anti-fuse gate dielectric layers GI of the anti-fuse cells experience breakdown (e.g., where an ohmic contact is formed).

According to a semiconductor memory device in accordance with example embodiments of the inventive concepts, since the anti-fuse gate electrode is provided thereunder with the channel impurity region whose conductivity is the same as that of the drain impurity region, when the gate dielectric layer of the anti-fuse experiences breakdown, it may be possible to reduce a leakage current flowing to the semiconductor substrate from the anti-fuse gate electrode. As a result, when sensing whether or not the anti-fuse cells are programmed, improvement may be achieved in current distribution measured from programmed anti-fuse cells.

Moreover, since the drain impurity regions are shared by the anti-fuse cells adjacent to each other, the anti-fuse cell array may have enhanced integration.

Although the invention has been described in connection with the embodiments of the invention illustrated in the accompanying drawings, it will be understood to those skilled in the art that various changes and modifications may be made without departing from the technical spirit and essential feature of the invention. It will be apparent to those skilled in the art that various substitution, modifications, and changes may be thereto without departing from the scope and spirit of the inventive concepts.

What is claimed is:

1. A semiconductor memory device, comprising:
   a semiconductor substrate including an active region defined by a device isolation layer, the active region having a first conductivity type;
   a pair of anti-fuse gate electrodes on the semiconductor substrate;
   anti-fuse gate dielectric layers between the anti-fuse gate electrodes and the substrate;
   a selection gate electrode on the semiconductor substrate, the selection gate electrode being spaced apart from the anti-fuse gate electrodes;
   a selection gate dielectric layer between the selection gate electrode and the substrate,
   first impurity regions in the active region below the pair of anti-fuse gate electrodes; and
   a second impurity region in the active region between the selection gate electrode and one of the pair of anti-fuse gate electrodes,
   the first and second impurity regions having impurities of a second conductivity type, the first impurity regions having an impurity concentration less than an impurity concentration of the second impurity region,
   wherein a portion of the device isolation layer is between the pair of anti-fuse gate electrodes,
   the selection gate electrode has a width that is substantially the same as a width of the pair of anti-fuse gate electrodes,
   the anti-fuse gate electrodes that are adjacent to each other are spaced apart from each other by a first distance, and
   the anti-fuse gate electrodes and an adjacent selection gate electrode are spaced apart from each other by a second distance that is substantially the same as the first distance.

2. The semiconductor memory device of claim 1, further comprising:
   a first impurity region in the active region, the anti-fuse gate electrode extending across the first impurity region.

3. The semiconductor memory device of claim 1, wherein the selection gate electrode extends across the active region.

4. The semiconductor memory device of claim 2, further comprising:
  a second impurity region in the active region between the selection gate electrode and the anti-fuse gate electrode, the second impurity region being connected to the first impurity region.

5. The semiconductor memory device of claim 4, wherein the first and second impurity regions have impurities of a second conductivity type, the first impurity region having an impurity concentration that is lower than an impurity concentration of the second impurity region.

* * * * *